(12) United States Patent
Ananthan et al.

(10) Patent No.: US 8,008,144 B2
(45) Date of Patent: Aug. 30, 2011

(54) DUAL WORK FUNCTION RECESSED ACCESS DEVICE AND METHODS OF FORMING

(75) Inventors: Venkatesan Ananthan, Boise, ID (US); Sanh D. Tang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 295 days.

(21) Appl. No.: 11/432,270

(22) Filed: May 11, 2006

(65) Prior Publication Data

US 2007/0264771 A1    Nov. 15, 2007

(51) Int. Cl.
H01L 29/94 (2006.01)

(52) U.S. Cl. ........ 438/199; 438/216; 257/369; 257/310

(58) Field of Classification Search ............... 438/197, 438/585, 586, 595, 596, 132
See application file for complete search history.

(56) References Cited

U.S. PATENT DOCUMENTS

| | | | |
|---|---|---|---|
| 4,714,519 A * | 12/1987 | Pfiester .................. 438/304 | |
| 5,013,680 A | 5/1991 | Lowrey et al. | |
| 5,122,848 A | 6/1992 | Lee et al. | |
| 5,547,890 A | 8/1996 | Tseng | |
| 5,619,057 A | 4/1997 | Komatsu | |
| 5,714,412 A | 2/1998 | Liang et al. | |
| 5,909,618 A | 6/1999 | Forbes et al. | |
| 5,941,701 A | 8/1999 | Moran et al. | |
| 5,960,270 A * | 9/1999 | Misra et al. ............. 438/197 | |
| 5,963,469 A | 10/1999 | Forbes | |
| 5,977,579 A | 11/1999 | Noble | |
| 6,072,209 A | 6/2000 | Noble et al. | |
| 6,130,453 A | 10/2000 | Mei et al. | |
| 6,150,687 A | 11/2000 | Noble et al. | |
| 6,191,470 B1 | 2/2001 | Forbes et al. | |
| 6,225,669 B1 * | 5/2001 | Long et al. ............. 257/401 | |
| 6,259,142 B1 | 7/2001 | Dawson et al. | |
| 6,300,177 B1 * | 10/2001 | Sundaresan et al. ....... 438/197 | |
| 6,313,046 B1 | 11/2001 | Juengling et al. | |
| 6,343,114 B1 | 1/2002 | Chea, Jr. | |
| 6,373,114 B1 | 4/2002 | Jeng et al. | |
| 6,383,879 B1 | 5/2002 | Kizilyalli et al. | |
| 6,498,062 B2 * | 12/2002 | Durcan et al. ........... 438/246 | |
| 6,534,837 B1 | 3/2003 | Bai et al. | |
| 6,548,870 B1 | 4/2003 | Lee | |
| 6,552,401 B1 | 4/2003 | Dennison | |
| 6,630,720 B1 * | 10/2003 | Maszara et al. ........... 257/407 | |
| 6,653,698 B2 | 11/2003 | Lee et al. | |
| 6,696,746 B1 | 2/2004 | Farrar et al. | |
| 6,841,834 B2 | 1/2005 | Nowak | |
| 6,844,578 B2 * | 1/2005 | Harada et al. ............. 257/278 | |
| 6,844,591 B1 | 1/2005 | Tran | |

(Continued)

OTHER PUBLICATIONS

WO, PCT/US2009/068123, May 17, 2010, Written Opinion.

(Continued)

*Primary Examiner* — Steven Loke
*Assistant Examiner* — David Goodwin
(74) *Attorney, Agent, or Firm* — Wells St. John P.S.

(57) ABSTRACT

A recessed access device having a gate electrode formed of two or more gate materials having different work functions may reduce the gate-induced drain leakage current losses from the recessed access device. The gate electrode may include a first gate material having a high work function disposed in a bottom portion of the recessed access device and a second gate material having a lower work function disposed over the first gate material and in an upper portion of the recessed access device.

14 Claims, 8 Drawing Sheets

U.S. PATENT DOCUMENTS

| | | |
|---|---|---|
| 6,924,190 B2 | 8/2005 | Dennison |
| 6,956,263 B1 * | 10/2005 | Mistry .................. 257/330 |
| 7,045,406 B2 | 5/2006 | Huotari et al. |
| 7,071,043 B2 | 7/2006 | Tang et al. |
| 7,122,425 B2 | 10/2006 | Chance et al. |
| 7,141,858 B2 | 11/2006 | Polishchuk et al. |
| 7,202,535 B2 * | 4/2007 | Goldbach et al. ........... 257/369 |
| 7,214,621 B2 | 5/2007 | Nejad et al. |
| 7,229,873 B2 | 6/2007 | Colombo et al. |
| 7,244,659 B2 | 7/2007 | Tang et al. |
| 7,262,089 B2 | 8/2007 | Abbott et al. |
| 7,282,401 B2 | 10/2007 | Juengling |
| 7,285,812 B2 | 10/2007 | Tang et al. |
| 7,316,950 B2 | 1/2008 | Park et al. |
| 7,332,433 B2 | 2/2008 | Choi et al. |
| 7,349,232 B2 | 3/2008 | Wang et al. |
| 7,384,849 B2 | 6/2008 | Parekh et al. |
| 7,456,469 B2 | 11/2008 | Yamazaki |
| 2002/0106858 A1 | 8/2002 | Zheng et al. |
| 2003/0203566 A1 | 10/2003 | McQueen et al. |
| 2004/0212024 A1 * | 10/2004 | Oh et al. .................. 257/396 |
| 2005/0139926 A1 | 6/2005 | Shimizu et al. |
| 2005/0202632 A1 | 9/2005 | Ding |
| 2006/0017099 A1 * | 1/2006 | Paik ........................ 257/330 |
| 2006/0046354 A1 * | 3/2006 | Kreipl ..................... 438/132 |
| 2006/0084247 A1 | 4/2006 | Liu |
| 2006/0157796 A1 | 7/2006 | Kim et al. |
| 2007/0262395 A1 | 11/2007 | Gibbons et al. |
| 2007/0262415 A1 | 11/2007 | Smith et al. |
| 2007/0264771 A1 | 11/2007 | Ananthan et al. |

OTHER PUBLICATIONS

WO, PCT/US2009/068123, May 17, 2010, Search Report.

Spee et al., "Low Temperature Deposition of TiN Ceramic Material by Metal Organic and/or Plasma Enhanced CVD", Journal De Physique IV, vol. 5, Jun. 1995, pp. C5-719-C5-734.

Zamouche et al., "Investigation of fast diffusing impurities in silicon by a transient ion drift method", Appl. Phys. Lett. 66 (5), Jan. 30, 1995, pp. 631-633.

* cited by examiner

DUAL WORK FUNCTION RECESSED ACCESS DEVICE AND METHODS OF FORMING

BACKGROUND OF THE INVENTION

1. Field of the Invention

The present invention relates to transistors and methods of making transistors in semiconductor devices. More particularly, the present invention relates to transistors formed of multiple materials having differing work functions.

2. State of the Art

Transistor devices are used with semiconductor devices for numerous purposes, and such use is well known. The characteristics of transistor devices are also well known and documented so that further research may improve the transistor devices. For example, in the case of NMOS transistor devices, it is well known that the drive current of an NMOS transistor device will be higher when a high work function gate material is used as opposed to a low work function gate material. The drive current is stronger in a high work function material because the substrate doping can be much lower with the high work function material, resulting in mobility improvement and the improved drive current.

Similar to NMOS transistor devices, access transistor devices used with memory devices, such as DRAM memory, exhibit a higher drive current when a high work function material is used to form the access transistor as compared to when a lower work function material is used. However, the use of a high work function material to form an access transistor in a memory device may lead to off-state leakage across the access transistor. Off-state leakage includes current leakage that occurs when the access transistor is in an "off" state. Typically, off-state leakage includes two types of leakage: sub-threshold leakage between a source and a drain region associated with the access transistor and leakage between the drain and the substrate of an access device. The leakage from the drain to the substrate may include both junction leakage and gate-induced drain leakage. Junction leakage may include Schokley-Read-Hall type junction leakage and is undesirable. Gate-induced drain leakage (GIDL) is also undesirable.

Recessed access devices (RADs) used as access transistors in memory devices are especially susceptible to gate-induced drain leakage when in an "off" state. The gate-induced drain leakage of a RAD structure dominates the off-state leakage that occurs with such devices. Thus the refresh rate of a RAD structure, and a memory device employing RAD structures, may be dependent upon the amount of gate-induced drain leakage in the RAD device.

Therefore, it is desirable to reduce the amount of gate-induced drain leakage in a RAD structure. It is also desirable to reduce the amount of gate-induced drain leakage while controlling or reducing the amount of other leakages present in the RAD structure or access transistor.

SUMMARY OF THE INVENTION

Embodiments of the invention relate to recessed access devices. More particularly, embodiments of the invention relate to recessed access devices having gate electrodes formed from two or more gate materials wherein at least two of the gate materials have different work functions. Embodiments of the invention also relate to methods of forming recessed access devices having two or more gate materials and methods for reducing gate-induced drain leakage (GIDL) current losses from a recessed access device.

According to some embodiments of the invention, the gate electrode of a recessed access device may be formed by two or more gate materials. A first gate material, having a first work function, may be formed in the bottom of a trench in a semiconductor substrate. One or more different gate materials may be disposed over the first gate material, the one or more different gate materials having at least a second work function wherein the second work function is lower than the first work function.

According to other embodiments of the invention, a recessed access device may be formed by depositing a first gate material over a gate-oxide material in a trench of a semiconductor substrate. The first gate material may have a high work function. A second gate material having a lower work function than the first gate material may be deposited over the first gate material in at least a portion of the trench. Additional gate materials may be deposited over the first and second gate materials. In addition, strap layers, insulating cap layers, and sidewall spacers may be formed over the first and second gate layers using conventional fabrication processes. The difference in work functions between the first gate material and the second gate material may reduce GIDL current losses from the recessed access device.

In still other embodiments of the invention, the gate-induced drain leakage current from a recessed access device may be reduced by forming the gate electrode of the recessed access device from two or more gate materials having different work functions. A first gate material having a high work function may be disposed in the bottom of a trench in a semiconductor substrate and a second gate material having a lower work function than the first gate material may be disposed over the first gate material in the trench. The difference in work functions between the first gate material and the second gate material may reduce the GIDL current losses from the recessed access device when the recessed access device is in an off-state.

According to other embodiments of the invention, recessed access devices having a gate electrode having two or more gate materials may be formed using materials as well as by methods disclosed in co-pending United States Patent Application Publication No. US 2007/0262395 A1 and is incorporated by reference in its entirety herein.

BRIEF DESCRIPTION OF THE DRAWINGS

While the specification concludes with claims particularly pointing out and distinctly claiming that which is regarded as the present invention, this invention may be more readily understood and appreciated by one of ordinary skill in the art from the following description of the invention when read in conjunction with the accompanying drawings in which:

DETAILED DESCRIPTION OF THE ILLUSTRATED EMBODIMENTS

According to embodiments of the invention, a recessed access device (RAD) structure may comprise both a high work function material and a lower work function material. The high work function material may be deposited in the bottom of a RAD structure between the source and drain junctions in a semiconductor device. The low work function material may be deposited over the high work function material and may fill the remainder of a RAD structure trench along a gate-drain overlap region in the RAD structures.

Figure 1:
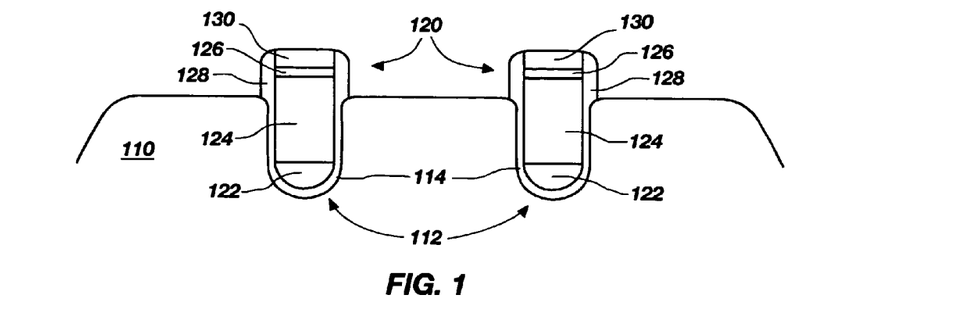
FIG. 1 illustrates a cross-sectional view of RAD structures in a semiconductor substrate according to embodiments of the invention.

A RAD structure according to embodiments of the invention is illustrated in FIG. 1. A semiconductor substrate 110 may include one or more trenches 112 having RAD structures 120 formed therein. The trenches 112 may be lined with a gate-oxide material 114. A first gate material 122 and a second gate material 124 may be deposited in the trenches 112 over the gate-oxide material 114. The first gate material 122 may include a high work function material and may be deposited in the bottom of the trenches 112 as illustrated. The second gate material 124 may include a material having a lower work function than the high work function material included in the first gate material 122. The second gate material 124 may be deposited over the first gate material 122 and it may extend outside of the trenches 112 formed in the semiconductor substrate 110 as illustrated. A strap layer 126 may be deposited over the second gate material 124 and an insulator cap layer 130 may be deposited over the strap layer 126. The RAD structures 120 may also include sidewall spacers 128 as illustrated in FIG. 1.

Figure 2:
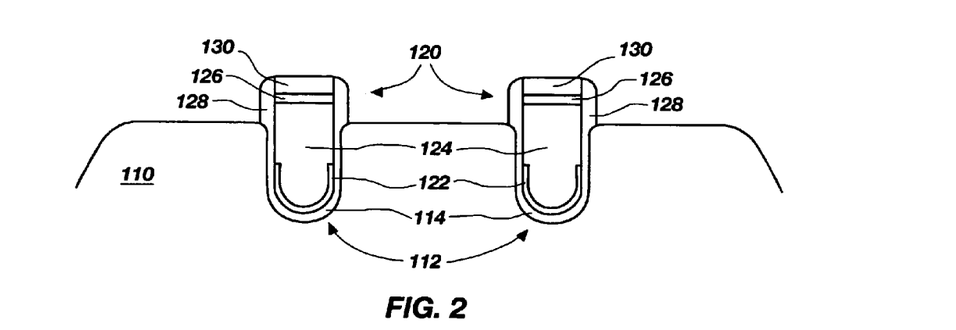
FIG. 2 illustrates a cross-sectional view of RAD structures in a semiconductor substrate according to embodiments of the invention.

FIG. 2 illustrates another embodiment of RAD structures 120 that may be formed according to embodiments of the invention. The RAD structures 120 may be formed in trenches 112 in a semiconductor substrate 110. A gate-oxide material 114 may line the trenches 112 and a first gate material 122 may overlie at least a portion of the gate-oxide material 114 in the trenches 112. The first gate material 122 may include a high work function material. A second gate material 124 may be deposited over the first gate material 122 in the trenches 112 and may extend over the first gate material 122 to contact the gate-oxide material 114 in at least a portion of the trenches 112 as illustrated in FIG. 2. A strap layer 126 and an insulator cap layer 130 may overlie the gate materials. The RAD structures 120 may also include sidewall spacers 128 extending from the insulator cap layer 130 to a surface of the semiconductor substrate 110.

Figure 3:
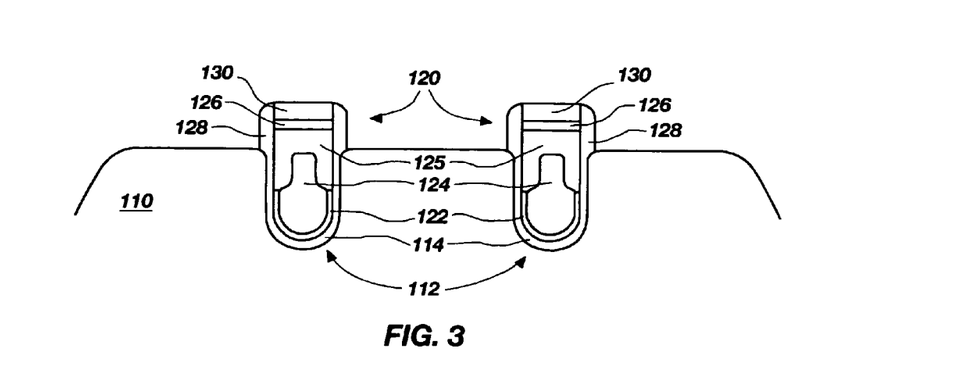
FIG. 3 illustrates a cross-sectional view of RAD structures in a semiconductor substrate according to embodiments of the invention.

FIG. 3 illustrates yet another embodiment of RAD structures 120 according to embodiments of the invention. The RAD structures 120 may be formed in trenches 112 in a semiconductor substrate 110. A gate-oxide material 114 may line at least a portion of the trenches 112. A first gate material 122 may be deposited such that it overlies at least a portion of the gate-oxide material 114 in the trenches 112. A second gate material 124 may overlie the first gate material 122 and may also contact (not shown) at least a portion of the gate-oxide material 114 in the trenches 112. A third gate material 125 may be formed over the second gate material 124 and may also extend around portions of the second gate material 124 as illustrated in FIG. 3. The third gate material 125 may contact at least a portion of the second gate material 124. The third gate material 125 may exhibit a work function lower than that of the first gate material 122. A strap layer 126 and an insulator cap layer 130 may overlie the gate materials. The RAD structures 120 may also include sidewall spacers 128 extending from the insulator cap layer 130 to a surface of the semiconductor substrate 110.

The semiconductor substrates 110 according to embodiments of the invention may include materials conventionally used with or for the fabrication of semiconductor substrates 110 for use with memory devices, access devices, and other semiconductor devices. For example, the semiconductor substrates 110 may include silicon-containing materials such as silicon, silicon-on-insulator structures, and silicon-on-sapphire structures.

Gate-oxide material 114 in the trenches 112 of the semiconductor substrates may include any gate-oxide layer that may be used with conventional RAD devices. In addition, the gate-oxide material 114 may include gate-oxides conventionally used with semiconductor devices and with transistors and gate stacks used with such semiconductor devices.

The strap layers 126, insulator cap layers 130, and sidewall spacers 128 incorporated with embodiments of the invention may include conventional structures such as those used in the formation of conventional RAD structures, gate stacks, and other access devices. For example, the strap layers 126 may include conductive materials such as metals, conductive silicon materials, doped silicon materials, and other conductors. In some embodiments, the strap layers 126 may be formed from low resistance materials, for example, the strap layers 126 may include tungsten (W) or tungsten silicon ($WSi_x$) materials. The insulator cap layers 130 may include insulating materials such as nitrides, n-doped polysilicon, or other insulating materials conventionally used to form insulating layers over memory devices, access devices, transistors, gate stacks, or other semiconductor devices. Similarly, the sidewall spacers 128 may be formed of materials conventionally used to form spacers with memory devices, access devices, transistors, gate stacks, or other semiconductor devices.

The gate materials of the present invention may include gate materials conventionally used to form gate stacks, and recessed access devices. However, according to embodiments of the invention, the first gate material 122 and the second gate material 124 may include materials having different work functions.

The first gate materials 122 according to embodiments of the invention may be selected to have a higher work function than the second gate materials 124. Gate materials having high work functions that may be used with embodiments of the invention may include materials such as p-type doped polysilicon, titanium nitride (TiN), tantalum nitride (TaN), tungsten nitride (WN), ruthenium (Ru), molybdenum nitride (MoN), or combinations of such materials such as, but not limited to, TaN/TiN, WN/TiN, p-type polysilicon/TiN.

The second gate materials 124 according to embodiments of the invention preferably have a lower work function than the first gate materials 122. The second gate materials 124 may include materials such as n-type doped polysilicon, undoped polysilicon, arsenic (As) doped polysilicon, phosphorus (P) doped polysilicon, aluminum (Al), titanium (Ti), tantalum (Ta), and zirconium nitride (ZrN).

According to some embodiments of the invention, the first gate material 122 and the second gate material 124 may include one or more layers of gate materials which comprise the first and second gate materials. For example, the first gate material 122 may include a first gate material layer (not shown) and a second first gate material layer (not shown) and the second gate material 124 may comprise two or more material layers. The first gate material 122 and second gate material 124 may also comprise mixtures or alloys of gate materials such that the first gate material 122 has a higher work function than the second gate material 124.

In other embodiments of the invention, additional gate material layers may be incorporated with the first gate materials 122 and the second gate materials 124 as exhibited by the inclusion of a third gate material 125 in the RAD structures 120 illustrated in FIG. 3. The third gate material 125 may include any gate material having a lower work function than that of the first gate material 122.

According to embodiments of the invention, a gate material which lines or is otherwise positioned in the bottom portion of a trench 112 of a RAD structure 120 will have the highest work function of the gate materials used to fabricate the RAD structure 120. For example, the first gate material 122 in FIGS. 1-3 may have a higher work function than the second gate material 124 or third gate material 125 overlying the first gate material 122. Positioning of a high work function gate material in the bottom portion of a trench 112 of a RAD structure 120 may decrease the amount of gate-induced drain leakage (GIDL) occurring in the RAD structure 120. This may be especially true when the RAD structure 120 is in an "off" state. The reduced amount of GIDL losses may improve the operation of the RAD structures 120.

The difference in work function between the gate material in the bottom portions of the trenches 112 of the RAD structures 120 and the gate materials used to complete the remainder of the gate structure in the RAD structures 120 may be very small according to embodiments of the invention. For example, the difference in work functions between gate materials used with embodiments of the invention may be about 0.4 eV. In other embodiments, the difference in work function values between the highest work function and the next lowest work function may be between about 0.2 eV and about 1.5 eV.

Use of a high work function material with the RAD structures according to embodiments of the invention may provide mobility improvement in a semiconductor device employing the high work function material. The high work function material may also contribute to a high drive current for the RAD structure. In addition, use of a low work function material in combination with the high work function material may decrease the amount of gate-induced drain leakage and improve the refresh rates for the RAD structure.

Figure 4A:
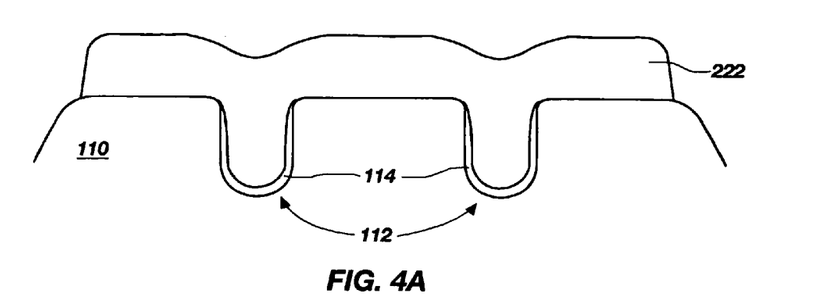
FIGS. 4A-4C illustrate cross-sectional views of the formation of RAD structures in a semiconductor substrate according to embodiments of the invention.
Figure 4B:
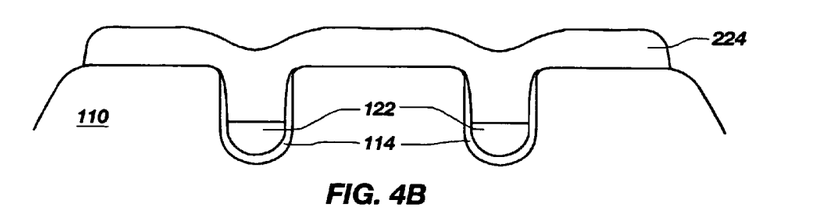
Figure 4C:
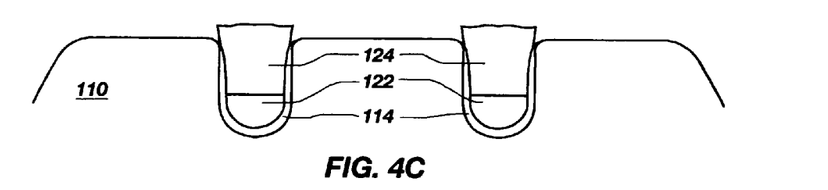

According to other embodiments of the invention, methods for producing RAD structures 120 are provided. FIGS. 4A-4C illustrate a series of fabrication steps that may be used to form the RAD structures 120 illustrated in FIG. 1 according to embodiments of the invention. In FIG. 4A a first gate material layer 222 is deposited over a semiconductor substrate 110 having trenches 112 formed therein. For example, the first gate material layer 222 may include titanium nitride (TiN) or tantalum nitride (TaN). The trenches 112 in the semiconductor substrate 110 may be formed by conventional trench forming processes such as by shallow-trench isolation (STI) processes prior to the deposition of the first gate material layer 222 over the semiconductor substrate 110. In addition, a gate-oxide material 114 may be grown, formed, or otherwise deposited over the trenches 112 according to conventional practices before depositing the first gate material layer 222 over the semiconductor substrate 110 and in the trenches 112 as illustrated in FIG. 4A.

As illustrated in FIG. 4B, the first gate material layer 222 may be masked or etched to form the first gate material 122 in the trenches 112. The masking and etching of the first gate material layer 222 may include conventional masking and etching processes as well as selective masking and etching processes to help ensure that a first gate material 122 is formed in a desired pattern. A second gate material layer 224 may be deposited over the first gate material 122 and in the trenches 112. The second gate material layer 224 may exhibit a lower work function than the first gate material 122. For example, the second gate material layer 224 may include an undoped polysilicon material or an n-doped polysilicon material.

Masking and etching of the second gate material layer 224 may result in the formation of the second gate material 124 as illustrated in FIG. 4C. The masking and etching may be performed using conventional masking and etching techniques, including selective etching if desired. Conventional processes may be used to deposit, mask, etch, or otherwise form a strap layer 126 over the second gate material 124, an insulator cap layer 130 over the strap layer 126, and sidewall spacers 128 as illustrated in FIG. 1.

The steps and processes illustrated in FIGS. 4A-4C may also be used to form RAD structures 120 similar to those illustrated in FIG. 2. In such processes, the masking and etching of the first gate material layer 222 may be performed such that a first gate material 122 as illustrated in FIG. 2 is formed.

According to other embodiments of the invention, the first gate material 122 may be formed and shaped as illustrated in FIG. 3. Various process steps in the formation of the RAD structures 120 illustrated in FIG. 3 are shown in FIGS. 5A-5D.

Figure 5A:
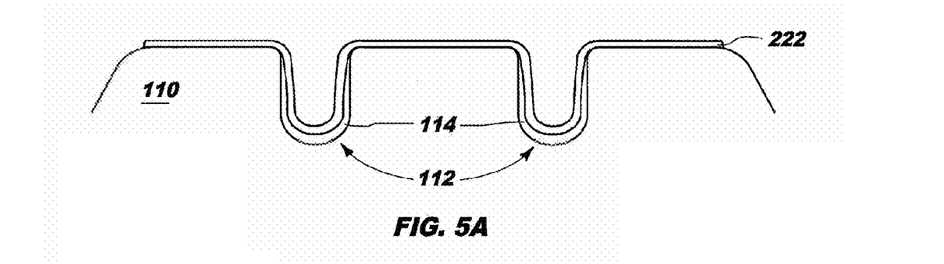
FIGS. 5A-5D illustrate cross-sectional views of the formation of RAD structures in a semiconductor substrate according to embodiments of the invention.

Similar to other processes for forming RAD structures according to embodiments of the invention, a semiconductor substrate 110 having trenches 112 formed therein and lined with a gate-oxide material 114 may be used to form the RAD structures 120 of FIG. 3. As illustrated in FIG. 5A, a first gate material layer 222 may be deposited over the gate-oxide material 114 overlying the semiconductor substrate 110. The first gate material layer 222 may be deposited or otherwise formed on the semiconductor substrate 110 and in the trenches 112 in a thin layer according to conventional methods and as illustrated in FIG. 5A. For example, a first gate material layer 222, comprising titanium nitride (TiN) or tantalum nitride (TaN) may be deposited over a semiconductor substrate 110 and in trenches 112 such that the thickness of the first gate oxide layer 222 is substantially uniform over the entire expanse of the semiconductor substrate 110 and in the trenches 112. In other embodiments, the first gate material layer 222 may be deposited or otherwise formed on the semiconductor substrate 110 and in the trenches 112 and then masked and etched to form a first gate material layer 222 that is substantially uniform in thickness.

Figure 5B:
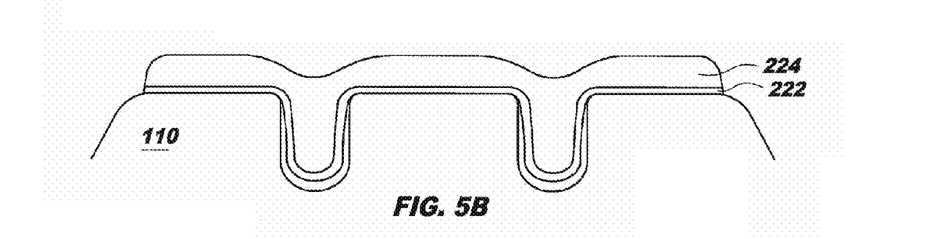

As illustrated in FIG. 5B, a second gate material layer 224 may be deposited over the first gate material layer 222 on the semiconductor substrate 110 and in the trenches 112. The second gate material layer 224 may have a work function that is smaller than the work function of the first gate material layer 222. For example, a second gate material layer 224 comprising undoped polysilicon or n-doped polysilicon may be deposited over the first gate material layer 222.

Figure 5C:
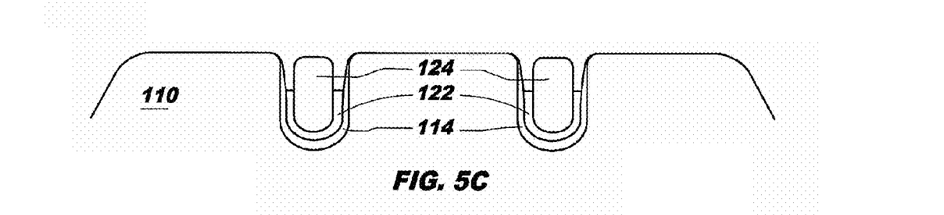

The second gate material layer 224 may be masked and etched to recess the second gate material layer 224 in the trenches 112 to a desired form to form the second gate material 124 as illustrated in FIG. 5C. The masking and etching of the second gate material layer 224 may be performed using conventional techniques. The first gate material 122 may also be selectively removed from the walls of the trenches 112 next to the second gate material 124. The removal of the first gate material 122 may be accomplished using conventional etching techniques. For example, a first gate material 122 comprising titanium nitride (TiN) may be selectively etched from within the trenches 112 using a wet etch process employing a mixture of $H_2O_2$, $NH_4OH$, and deionized water. In this manner, the first gate material 122 may be etched to a desired length without damaging the second gate material 124.

Figure 5D:
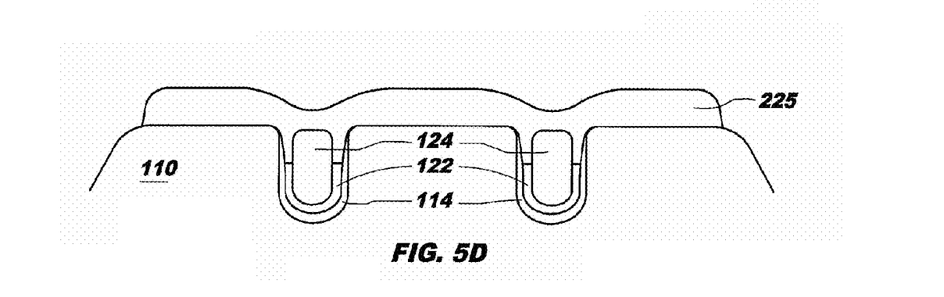

A third gate material layer 225 may be deposited over the second gate material 124 and the first gate material 122 in the trenches 112 as illustrated in FIG. 5D. The third gate material layer 225 may then be masked and etched according to conventional techniques to form a third gate material 125 and the remainder of the gate of the RAD structures 120 as illustrated in FIG. 3. The gate may include the first gate material 122, the second gate material 124 and the third gate material 125. The third gate material layer 225 may, for example, be a layer of n-type polysilicon or undoped polysilicon. The third gate material 125 may also be doped with a dopant such as phosphorus (P) or arsenic (As). The third gate material layer 225 may also be the same material as used in the formation of the second gate material 124. In at least some embodiments, the work function of the third gate material 125 is less than that of the first gate material 122.

A strap layer 126, an insulator cap layer 130, and sidewall spacers 128 may be formed over and next to the unfinished RAD structure 120 illustrated in FIG. 5D to form a RAD structure 120 such as that illustrated in FIG. 3.

Although various embodiments of the invention present RAD structures 120 having different configurations, embodiments of the invention are not limited by the configuration of the RAD structure 120 or the gate materials within the RAD structure. According to embodiments of the invention, the gate of a RAD structure 120 may be formed of two or more materials having different work functions, wherein the work function of one material is higher than the other materials used.

Embodiments of the invention having both low work function materials and high work function materials used to form gate electrodes of RAD structures 120 are capable of achieving high drive currents during on-states of the RAD structure 120 while limiting GIDL losses during off-states.

A series of RAD structures were simulated using ATLAS (a software program by Silvaco, Inc. used to simulate electrical characteristics of semiconductor devices) to ensure that the multi-work function RAD structures 120 according to embodiments of the invention provided a decrease in GIDL losses from the RAD structures 120.

Figure 6:
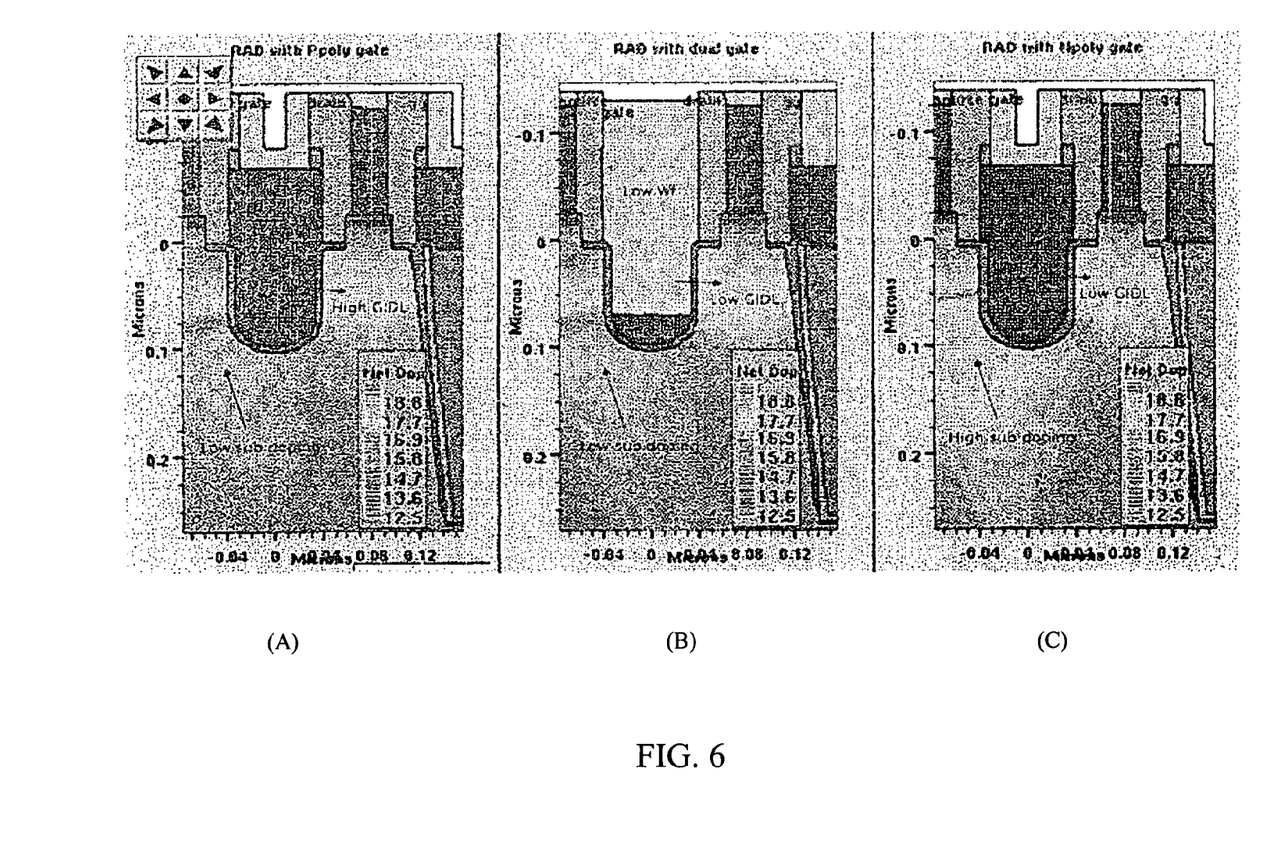
FIG. 6 illustrates cross-sectional views of three simulated recessed access devices, wherein the first simulated recessed access device includes a high work function gate material, the second simulated recessed access device includes a multi-work function gate material according to embodiments of the invention, and the third recessed access device includes a low work function gate material.

Three simulated recessed access device structures were created, tested, and analyzed using ATLAS. Examples of the three recessed access devices are illustrated in FIG. 6. The first recessed access device (A) is a simulated recessed access device having a p-doped polysilicon gate electrode, or in other words, a high work function gate electrode. The second recessed access device (B) is a simulated recessed access device having a multi-work function gate electrode according to embodiments of the present invention. The second recessed access device (B) was simulated with a high work function material, such a p-doped polysilicon having a work function of about 5.1 eV, in the bottom of the trench of the second recessed access device (B) and a lower work function material, such as an n-doped or undoped polysilicon having a work function of about 4.6 eV, in the upper portion of the trench. The third recessed access device (C) includes a low work function gate electrode, such as a gate electrode formed from n-doped or undoped polysilicon. The dimensions and doping concentrations of each of the three recessed access devices were kept constant but for the gate electrodes for the ATLAS test to ensure that the threshold voltage in the devices were the same for the tests.

A simulated GIDL current was tested for the first and second recessed access devices illustrated in FIG. 6. The results are plotted in FIG. 7. As can be seen by the plotted data, the GIDL current at a gate voltage ($V_{ccp}$) of about 1.5 eV drops by about an order of magnitude for a change in work function of 0.5 eV. The GIDL current is less for the second recessed access device (B) illustrated in FIG. 6 as compared to the first recessed access device (A).

Figure 7:
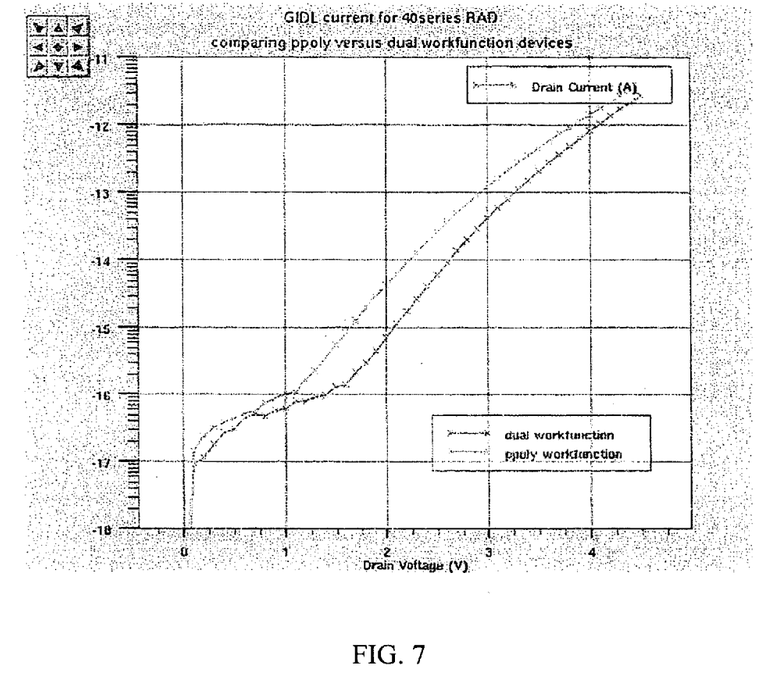
FIG. 7 illustrates a plot of the gate-induced drain leakage current of a recessed access device according to embodiments of the invention as compared to a conventional recessed access device having a high work function gate material.

The reduction in GIDL loss in the multi-work function recessed access device plotted in FIG. 7 indicates that reductions in GIDL may be achieved by increasing the work function difference between gate electrode materials used with embodiments of the invention. For example, the use of a high work function material, such as titanium nitride (TiN) having a work function of about 4.9 eV, at the bottom of a recessed access device and a lower work function material, such as an n-type polysilicon, to fill the remainder of a recessed access device may provide a reduction in GIDL losses for the recessed access device. In addition, increasing the difference in work functions between the materials used to form multi-work function gate electrodes in recessed access devices according to embodiments of the invention may further limit GIDL losses in a recessed access device. Furthermore, the use of the high work function material in the bottom of the recessed access device reduces the amount of substrate doping that is necessary to control GIDL, thereby increasing the drive current of the device. The reduction in GIDL also increases or improves the refresh performance of a recessed access device.

Figure 8A:
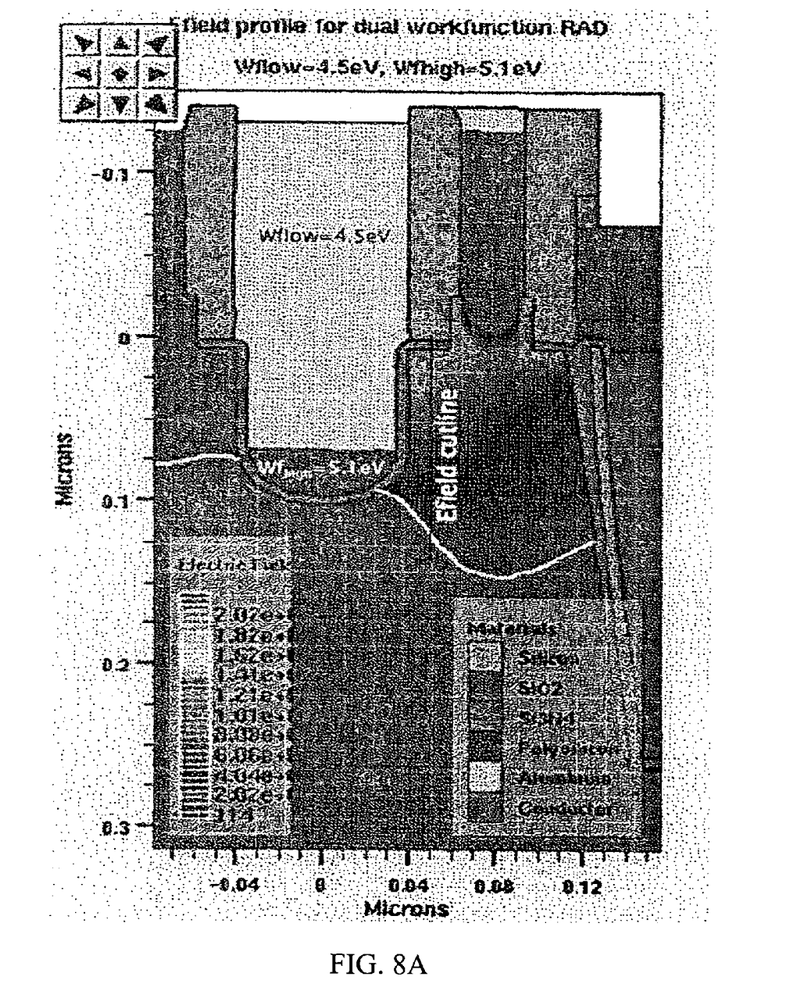
FIG. 8A illustrates a cross-sectional view of a simulated recessed access device having a multi-work function gate electrode according to embodiments of the invention.
Figure 8B:
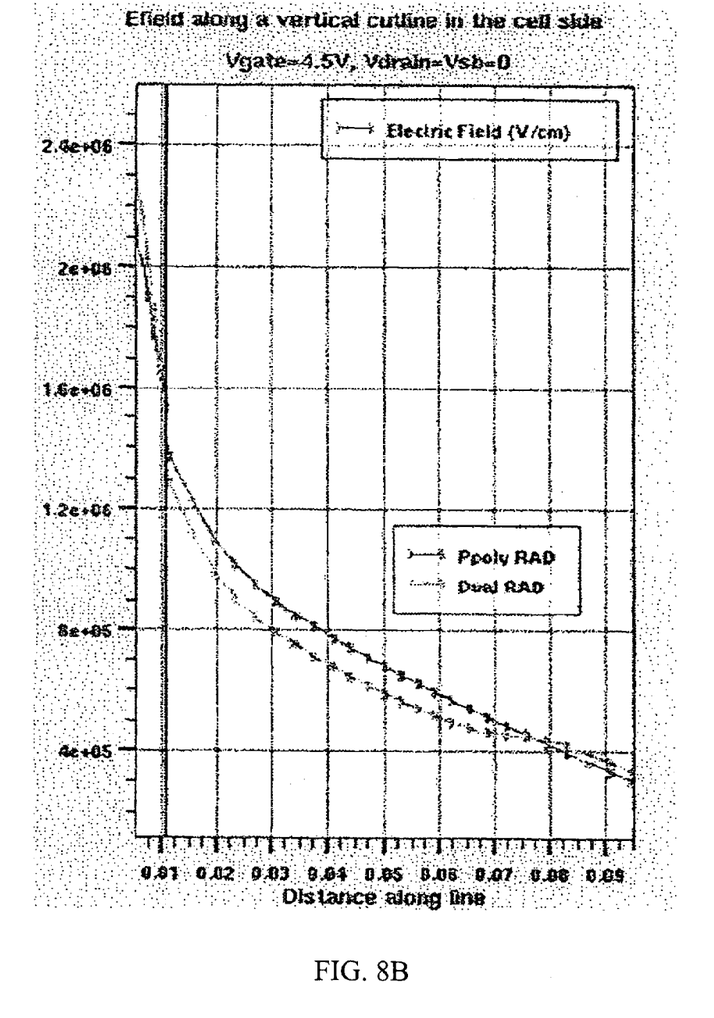
FIG. 8B illustrates a plot of the electric fields on the cell side of a recessed access device for a multi-work function gate electrode according to embodiments of the invention and a conventional high work function gate electrode.

The electric field characteristics of the multi-work function recessed access devices according to embodiments of the invention were also compared to the electric field characteristics of a recessed access device having a high work function gate electrode. FIG. 8A illustrates recessed access devices according to embodiments of the invention, having a high work function material in the bottom of the recessed access device trench and a lower work function material overlying the high work function material and comprising the remainder of the gate electrode of the recessed access device. The electric field along the electric field cutline (Efield cutline) illustrated in FIG. 8A was tested and the results plotted in FIG. 8B. An electric field along a similar point in a recessed access device having a p-type polysilicon gate electrode (a high work function gate electrode) is also plotted in FIG. 8B. As can be seen in the electric field plot, the electric field of the multi-work function recessed access device according to embodiments of the invention along the cutline in the cell side of a multi-work function recessed access device is lower than that of a high work function recessed access device. The inclusion of the lower work function material in the multi-work function recessed access device of embodiments of the invention therefore reduces GIDL current in the recessed access device.

Figure 9:
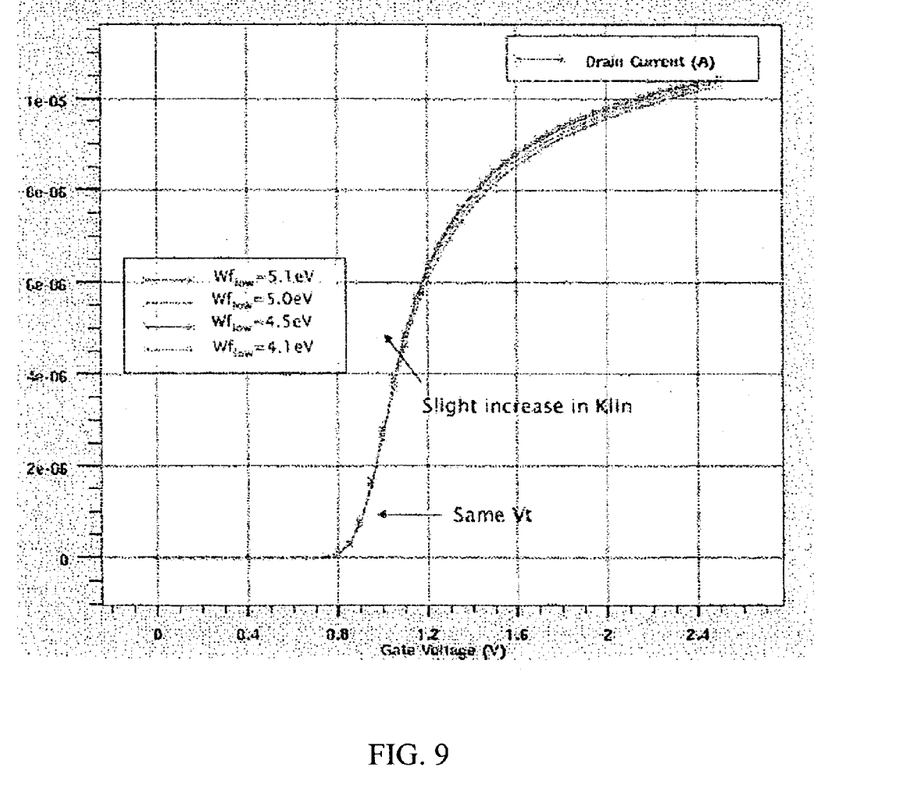
FIG. 9 illustrates a plot of the threshold voltages of recessed access devices according to embodiments of the invention wherein the work functions of the low work function material in the gate electrodes of the recessed access devices are different.

Multi-work function recessed access devices according to embodiments of the invention were also tested to determine if a decrease in the work function of the lower work function material used to form the gate electrode would create a difference in the threshold voltage of the recessed access device. Threshold voltages for four recessed access devices according to embodiments of the invention were tested and plotted wherein the lower work function materials used to form the gate electrodes included low work function materials having work functions of 5.1 eV, 5.0 eV, 4.5 eV, and 4.1 eV, respectively. A plot of the threshold voltages appears in FIG. 9. The plotted data indicate that the threshold voltages for a multi-work function gate electrode in a recessed access device according to embodiments of the invention remains relatively constant regardless of the lower work function material used to form the gate electrode.

Recessed access devices employing two or more different work function materials in a gate electrode according to embodiments of the invention enjoy both high drive currents similar to high work function gate electrodes and low GIDL current similar to low work function gate electrodes.

Having thus described certain currently preferred embodiments of the present invention, it is understood that the invention defined by the appended claims is not to be limited by particular details set forth in the above description, as many apparent variations thereof are contemplated without departing from the spirit or scope thereof as hereinafter claimed.

What is claimed is:

1. A method of forming a recessed access device, comprising:
   providing a semiconductor substrate having at least one trench formed therein;
   forming a gate-oxide layer over a surface of the at least one trench;
   forming a layer of substantially uniform thickness of a first gate material having a first work function over at least a portion of the gate-oxide layer in a bottom portion of the at least one trench, the first gate material comprising material selected from the group consisting of p-type doped polysilicon, titanium nitride (TiN), tantalum nitride (TaN), tungsten nitride (WN), ruthenium (Ru), molybdenum nitride (MoN), TaN/TiN, WN/TiN, p-type polysilicon/TiN, and combinations thereof;
   removing at least a portion of the layer of first gate material to expose at least a portion of the gate-oxide layer in the at least one trench;
   forming a second gate material having a second work function over the first gate material in at least a portion of the at least one trench, wherein the second work function is lower than the first work function; and
   forming a third gate material over the first gate material and the second gate material, wherein the third gate material contacts the at least a portion of the gate-oxide layer in the at least one trench exposed by removing at least a portion of the layer of first gate material.

2. The method of claim 1, wherein forming a second gate material comprises forming a second gate material selected from the group consisting of polysilicon, n-doped polysilicon, phosphorus (P) doped polysilicon, and arsenic (As) doped polysilicon over the first gate material.

3. The method of claim 1, further comprising:
   forming a conductive strap layer over the second gate material;
   forming an insulating cap layer over the conductive strap layer; and
   forming sidewall spacers from the insulating cap layer to a surface of the semiconductor substrate.

4. A method of forming a recessed access device, comprising:
   providing semiconductor material having at least one trench formed therein;
   forming a gate dielectric over a surface of the at least one trench, the gate dielectric comprising an arcuate outer surface in a bottom portion of the at least one trench;
   forming a first gate material having a first work function over at least a portion of the gate dielectric in the bottom portion of the at least one trench, the first gate material being formed to be U-shaped in a lateral cross section; and
   forming a second gate material having a second work function over the first gate material in at least a portion of the at least one trench and into a lateral center of the U of the U-shaped cross section first gate material, wherein the second work function is lower than the first work function, the second gate material being formed to have an upper neck portion within the trench and a lower shouldered portion within the trench in the lateral cross section, the upper neck portion being laterally centered relative to the shouldered portion.

5. The method of claim 4 comprising forming a third gate material within the trench over the first gate material and the second gate material.

6. The method of claim 5 wherein the third gate material has a lower work function than the first work function.

7. The method of claim 4 wherein the semiconductor material within which the trench is provided has an elevationally outermost surface, the neck portion of the second gate material being everywhere received elevationally inward of the elevationally outermost surface of the semiconductor material.

8. A method of forming a recessed access device, comprising:
   providing a semiconductor substrate having at least one trench formed therein;
   lining the trench with gate dielectric;
   lining the trench with a first gate material over the gate dielectric, the first gate material having a first work function;
   overfilling the trench with a second gate material having a second work function which is lower than the first work function;
   removing the second gate material to expose the first gate material which lines the trench; and
   etching the exposed first gate material to recess it within the trench and leave second gate material within the trench projecting outwardly relative to the recessed first gate material.

9. The method of claim 8 comprising forming a third gate material within the trench over the first gate material and the second gate material.

10. The method of claim 9 wherein the third gate material has a lower work function than the first work function.

11. A method of forming a recessed access device, comprising:
   providing a semiconductor substrate having at least one trench formed therein;

forming a gate dielectric layer over a surface of the at least one trench;

forming a first gate material having a first work function over at least a portion of the gate dielectric layer in a bottom portion of the at least one trench;

removing at least a portion of the layer of first gate material to expose at least a portion of the gate dielectric layer in the at least one trench;

forming a second gate material having a second work function over the first gate material in at least a portion of the at least one trench, wherein the second work function is lower than the first work function; and forming a third gate material over the first gate material and the second gate material, wherein the third gate material contacts the at least a portion of the gate dielectric layer in the at least one trench exposed by removing at least a portion of the layer of first gate material.

12. The method of claim 11 wherein the third gate material has a lower work function than the first work function.

13. A method of forming a recessed access device, comprising:

providing semiconductor material having at least one trench formed therein;

forming a gate dielectric over a surface of the at least one trench, the gate dielectric comprising an arcuate outer surface in a bottom portion of the at least one trench;

forming a first gate material having a first work function over at least a portion of the gate dielectric in the bottom portion of the at least one trench, the first gate material comprising an arcuate outer surface in a bottom portion of the at least one trench; and forming a second gate material having a second work function over the arcuate outer surface of the first gate material in at least a portion of the at least one trench, wherein the second work function is lower than the first work function, the second gate material being formed to have an upper neck portion within the trench and a lower shouldered portion within the trench in the lateral cross section, the upper neck portion being laterally centered relative to the shouldered portion.

14. The method of claim 13 wherein the semiconductor material within which the trench is provided has an elevationally outermost surface, the neck portion of the second gate material being everywhere received elevationally inward of the elevationally outermost surface of the semiconductor material.

* * * * *